United States Patent [19]

Chiba et al.

[11] Patent Number: 5,627,365
[45] Date of Patent: May 6, 1997

[54] SCANNING NEAR-FIELD OPTIC/ATOMIC FORCE MICROSCOPE IN WHICH IMAGING LIGHT IS CONTROLLED IN RELATION TO A VIBRATING POSITION OF AN OPTICAL FIBER PROBE

[75] Inventors: Norio Chiba; Hiroshi Muramatsu, both of Chiba, Japan

[73] Assignee: Seiko Instruments Inc., Japan

[21] Appl. No.: 408,622

[22] Filed: Mar. 22, 1995

[30] Foreign Application Priority Data

Mar. 24, 1994 [JP] Japan .................... 6-054093

[51] Int. Cl.⁶ .................................................. H01J 3/14
[52] U.S. Cl. ........................ 250/234; 250/306; 73/105
[58] Field of Search ........................ 250/234, 309, 250/310, 311, 306; 73/104, 105

[56] References Cited

U.S. PATENT DOCUMENTS 5,333,495  8/1994  Yamaguchi et al. ............... 73/105
5,357,105  10/1994  Harp et al. ....................... 250/234
5,465,046  11/1995  Campbell et al. ................. 324/244

FOREIGN PATENT DOCUMENTS 0622652  4/1994  European Pat. Off. .

OTHER PUBLICATIONS

Applied Physics Letters, vol. 60, No. 24, 15 Jun. 1992, New York, NY, pp. 2957–2959, R. Toledo–Crow et al., "Near–field differential scanning optical microscope with atomic force regulation".

SPIE, vol. 1639, 20 Jan. 192, Bellingham, WA, pp. 36–43, N.F. van Hulst et al., "Operation of a scanning near field optical microscope in reflection in combination with a scanning force microscope".

SPIE, vol. 1855, 1993, Bellingham, WA, pp. 58–66, P.J. Moyer et al., "Sheap force/reflection near–field scanning optical microscopy".

Ultramicroscopy, vol. 57, No. 2–3, Feb., 1995, Netherlands, pp. 141–146, H. Muramatsu et al., "Scanning near–field optic/atomic-fore microscopy".

*Primary Examiner*—Edward P. Westin
*Assistant Examiner*—Stephen Calogero
*Attorney, Agent, or Firm*—Adams & Wilks

[57] ABSTRACT

A radiated light of a light source for optical characteristic measurement is amplitude modulated by an optical modulator and directed into a light-propagating probe. A phase and intermittent rate of the optical modulator are adjusted by a phase shifter. A sample characteristic measuring light is radiated onto the surface of the sample from the distal end of the probe. A light transmitted through or scattered by the sample, or fluorescent light generated from the sample is directed into a photoelectric converter via an optical system. The light radiating area of sample characteristic measuring light can be efficiently modified to improve the resolution of a light characteristic image of the surface topography and optical characteristic of the sample at high resolution, without relying on the existence of transmissivity and conductivity in the sample.

3 Claims, 4 Drawing Sheets

SCANNING NEAR-FIELD OPTIC/ATOMIC FORCE MICROSCOPE IN WHICH IMAGING LIGHT IS CONTROLLED IN RELATION TO A VIBRATING POSITION OF AN OPTICAL FIBER PROBE

BACKGROUND OF THE INVENTION

The present invention relates to a scanning near-field optic/atomic force microscope for observing the topography of a substance to be investigated, by making use of an atomic force acting between substances, and at the same time for observing the optical property of a microscopic region of the investigated substance by a probe consisting of a light-propagating body.

Atomic force microscopes (AFMs) are capable of accurately observing the topography of the surface of a sample, irrespective of whether the sample is conductive or not, in contrast with scanning tunneling microscopes (STMs) and, therefore, AFMs are widespread. Atomic force microscopy is a measuring method utilizing the fact that a spring element supporting a measuring probe is deflected by an atomic force acting between a sample and the measuring probe.

In an attempt to measure the optical characteristics and the topography of a sample, a probe consisting of a light transmissive medium having a sharp front end was brought close to the sample to be investigated such that the distance between them was less than the wavelength of the light. Also, some near-field optical microscopes have been proposed. In one of these proposed optical microscopes, laser light is directed from the rear side of a sample such that the light is totally reflected by the rear surface of the sample. Evanescent light leaking from the front surface of the sample is detected by bringing the front end of an optical fiber probe close to the surface of the sample, the probe being equipped with a fine-motion mechanism. The topography of the surface is observed in the way that the probe is scanned horizontally and vertically so as to detect constant evanescent light, or the probe is scanned horizontally so as to measure variations in the intensity of the evanescent light.

In another proposed apparatus, the front end of an optical fiber probe is held vertical to a sample. The front end is vibrated horizontally over the surface of the sample to produce friction between the sample surface and the front end of the probe, thus resulting in vibrations. Variations in the amplitude of the vibrations are detected as deviations of the optical axis of laser light which is emitted from the front end of the optical fiber and transmitted through the sample. A fine-motion mechanism is actuated to move the sample so that the distance between the front end of the probe and the sample surface is maintained constant. The surface topography is detected from the intensity of the signal applied to the fine-motion mechanism. Also, the transmissivity of the sample for the light is measured.

In a further proposed apparatus, a glass capillary having a hook-shaped front end portion is used. A fluorescent material is loaded into the tip portion of the capillary. A reflecting sheet for optically detecting deflections of the probe is installed on the rear side of the capillary, i.e. on the opposite side of the front end of the hook-shaped portion. Light is emitted from the back side of the sample and transmitted through the sample. This causes the fluorescent material at the front end of the probe close to the sample to emit light, which is transmitted through the sample. This light is detected on the rear side of the sample. In this way, the sample is investigated by atomic force microscopy. At the same time, the transmissivity is measured.

A still other proposed apparatus uses a probe consisting of an electrically conductive and light transmissive medium as an STM probe so as to measure the optical characteristics of the sample simultaneously.

The prior art AFM and STM techniques are adapted for observation of surface topography but are incapable of measuring the physical and chemical natures of a sample. A method of using light as a means for observing these properties of a sample is contemplated.

In some apparatuses of near-field optical microscopes, an evanescent light is used as the above-described light. In such an apparatus, light intensity is used as information regarding the direction of height. Therefore, it is impossible to separate variations in the light intensity in the direction of height from light intensity variations due to absorption of light into a sample. Hence, it is difficult to use this apparatus as a means for measuring the physical and chemical properties of a sample. Where the sample surface is greatly uneven, light may not be totally reflected by the rear surface of the sample but be transmitted through it. Transmitted light rays may interfere with each other on the surface of the sample, thus hindering measurement.

In an apparatus for dividing a topography image and optical characteristic image of a sample to simultaneously measure them, a non-contact type atomic force microscope or shear force type atomic force microscope wherein a probe which is a light propagating body has been proposed. In such apparatuses, where light is constantly radiated onto the sample, there is the problem that detection is impossible where the light intensity to be detected is low. Also, where the sample is a fluorescent material, there is the possibility that the sample will receive damage from the constant light radiation. Further, in a non-contact type atomic force microscope which vibrates the probe vertically with respect to the sample, because the spot of the light radiated when the probe distal end is distanced from the sample surface during the phase of a vibration cycle is broadened when it arrives at the sample surface, the light intensity and resolution thereof are reduced. In a shear force type atomic force microscope where the probe is vibrated horizontally with respect to the sample, the light radiated when the probe distal end is displaced from the vibration center during the phase of a vibration cycle is displaced from the measurement point, therefore resolution is reduced. Where the sample is a fluorescent material there are cases where, when a metal is brought into contact with the fluorescent body, the fluorescent energy thereof is absorbed by the metal and fluorescence is not produced, and where light propagating probes having a metal covering over the distal portion thereof are used, cases where light radiation is necessary during the phase where the probe distal end is distanced from the sample surface must be considered.

SUMMARY OF THE INVENTION

It is an object of the present invention to provide an apparatus for performing measurement of the surface topography and optical characteristic of a sample with improved resolution of a light characteristic image, without relying on the existence of transmissivity and conductivity in the sample.

In order to achieve the above object, a scanning near-field optic/atomic force microscope comprises a probe consisting of a light-propagating body, vibration means for vibrating a position relation between a distal end of the probe and the sample vertically relative thereto, a light source for radiating light onto the sample, optical modulating means for modulating an amplitude of the light in synchronism with vibration of the probe, a phase shifter for modifying a phase or intermittent rate of the optical modulating means, displacement detection means for optically detecting displacement of the probe, a photoelectric converter and optical system for detecting light from the sample, a rough-motion mechanism and fine-motion mechanism for moving the sample and the probe relative to each other, and a control apparatus for controlling a total apparatus.

Also, the scanning near-field optic/atomic force microscope comprises a probe consisting of a light-propagating body, vibration means for vibrating a position relation between a distal end of the probe and the sample horizontally relative thereto, a light source for radiating light onto the sample, optical modulating means for modulating an amplitude of the light in synchronism with vibration of the probe, a phase shifter for modifying a phase or intermittent rate of the optical modulating means, displacement detection means for optically detecting displacement of the probe, a photoelectric converter and optical system for detecting light from the sample, a rough-motion mechanism and fine-motion mechanism for moving the sample and the probe relative to each other, and a control apparatus for controlling a total apparatus.

In the structure of a scanning near-field optic/atomic force microscope as described above, since light radiated onto the sample is modulated by the operation of the light modulator, the measuring light can be phase-detected and consequently a weak signal can be detected. Also, because light is intermittently radiated onto the sample, the operation thereof is such that a fluorescent sample can be prevented from receiving damage due to the light.

Further, the phase and intermittent rate of sample radiation light with respect to vibration of the probe can be arbitrarily modified by the phase shifter. Consequently, in an apparatus in which the probe's distal end is vertically vibrated with respect to the sample, the light radiation area can be reduced and light intensity increased due to light being radiated at a phase where the probe is at maximum proximity to the sample. Also, in the phase where the probe is at maximum proximity to the sample, by reducing the phase limits at which the light is radiated, the light radiation area can be further reduced and light intensity further increased. Further, where a fluorescent sample is measured, by reducing the phase limits at which light is radiated the fluorescent sample can be prevented from receiving damage due to light. Further still, where a fluorescent sample is measured using a probe having a metallic covering, by radiating light at a phase wherein the probe distal end is distanced from the surface of the sample the fluorescent energy can be prevented from being absorbed by the metallic covering and the detected fluorescent light intensity can be increased. Further yet, in an apparatus where the probe distal end is vibrated horizontally with respect to the sample, by radiating the light in the center of vibration during a phase of the vibration cycle, it is possible to align the measurement point and light radiation point.

DETAILED DESCRIPTION OF THE PREFERRED EMBODIMENTS

Embodiments of the present invention will be described below with reference to the drawings.

Figure 1:
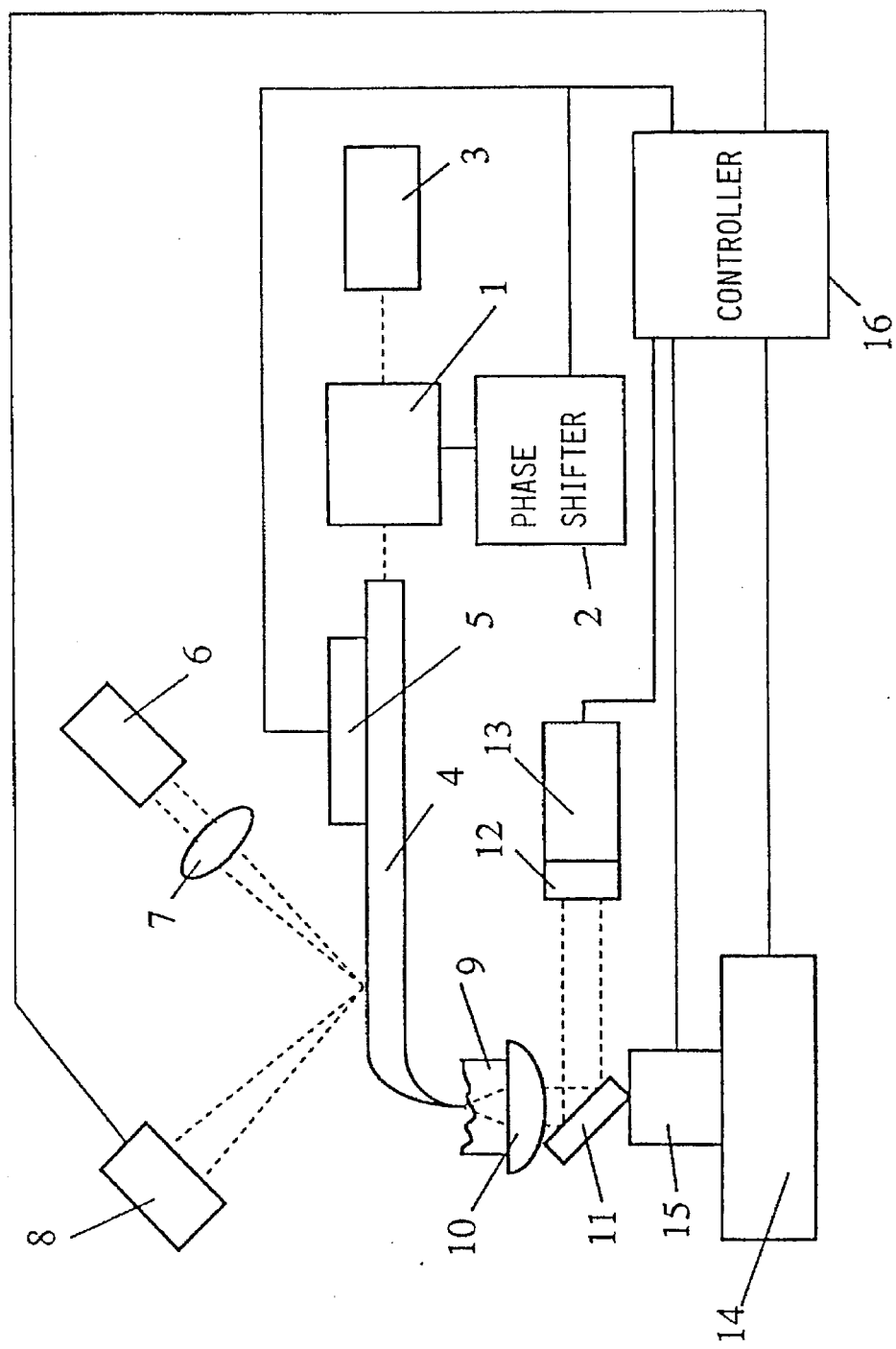
FIG. 1 shows a structure of a scanning near-field optic/atomic force microscope according to an embodiment of the present invention.

FIG. 1 is a diagram of the structure of a scanning near-field optic/atomic force microscope according to an embodiment of the present invention, and shows the structure for vibrating the distal end of a probe vertically with respect to a sample. Radiated light of an optical characteristic measuring light source 3 is amplitude modulated by an optical modulator 1 and directed to a light propagating probe 4 disposed in a bimorph 5. The phase and intermittent rate of the optical modulator 1 are adjusted by a phase shifter 2. A laser light source 6, condenser lens 7 and photoelectric converter 8 are disposed above the probe 4, the laser light beam of the laser light source 6 is focussed onto the rear surface of the probe 4 by the condenser lens 7 and the reflected light is directed to the photoelectric converter 8.

Sample characteristic measuring light is radiated onto the surface of the sample 9 from the distal end of the probe 4, and light transmitted through or scattered by the sample 9, fluorescent light generated from the sample 9, etc., is rendered parallel by a lens 10 and directed onto a photoelectric converter 13 via a mirror 11 and a filter 12. The mirror 11, lens 10 and sample 9 are disposed on a rough-motion mechanism 14 and fine-motion mechanism 15 movable in three-dimensional, i.e. length, breadth and depth, directions. A signal detected by the photoelectric converter 8 is transmitted to a controller 16, which outputs a signal based on the detected signal to control the rough-motion mechanism 14 and the fine-motion mechanism 15 when the probe 4 approaches or topographically observes the surface of the sample 9 so that deflection of the probe 4 does not exceed a specified value. A phase detector is included in the controller 16.

As the optical modulator 1, devices for modulating light resulting from an external signal, such as an AO modulator (audio-optical modulator), EO modulator (electrical optical modulator), mechanical shutter, liquid crystal shutter or the like, can be used. As the optical characteristic measuring light source 3, a laser light source such as a gas laser, solid-state laser, semiconductor laser and the like, a light-emitting diode, discharge tube, white light source and the like can be used. Where a light source which has a quick response such as a semiconductor laser is used, it is possible to remove the optical modulator 1 and to modulate directly to the optical characteristic measuring light source.

According to the structure of the scanning near-field optic/atomic force microscope as described above, the phase and intermittent rate of the sample radiating light can be arbitrarily changed with respect to the vibration of the probe.

Figure 3A:
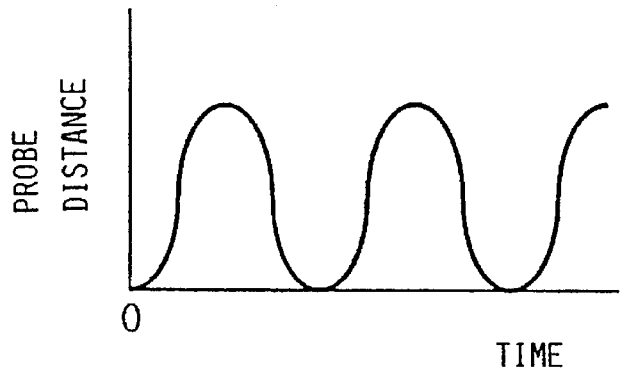
FIGS. 3A and 3B show diagrams of a first example of the phase of sample irradiating light with respect to vibration of the probe.
Figure 3B:
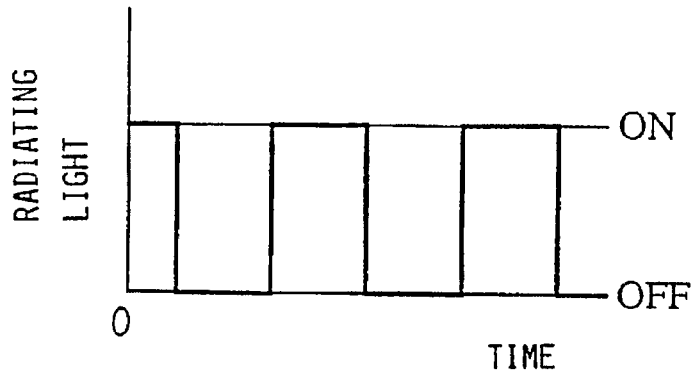

FIGS. 3A and 3B are diagrams showing a first example of the phase of the sample radiating light with respect to the vibration of the probe, FIG. 3A representing the change of the distance between the probe and the sample over time, and FIG. 3B representing the ON and OFF switching of the sample radiating light corresponding to the time of FIG. 3(A). As shown in FIG. 3, by radiating light at the phase where the probe is at maximum proximity to the sample, the light radiating limits are reduced and light intensity can be increased. Also, optical characteristic light from the sample can be phase-detected and therefore weak signals can be detected. Further, since the light is radiated onto the sample intermittently, a fluorescent sample can be prevented from receiving damage. Consequently, it is possible to improve the resolution and S/N ratio of the detected optical signal.

Figure 4A:
FIGS. 4A and 4B show diagrams of a second example of the phase of sample irradiating light with respect to vibration of the probe.
Figure 4B:
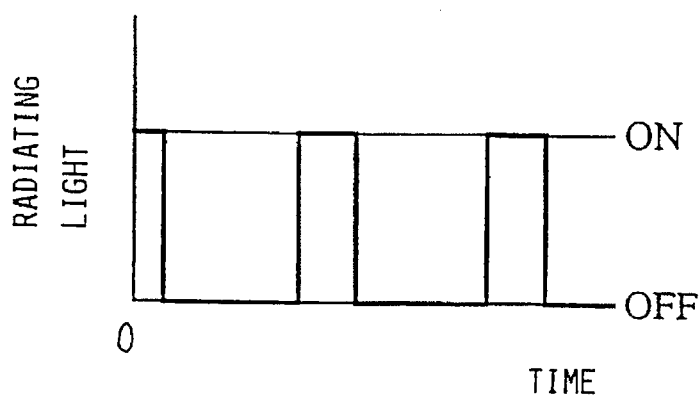

FIGS. 4A and 4B are diagrams showing a second example of the phase of the sample radiating light with respect to the vibration of the probe, FIG. 4A representing the change of the distance between the probe and the sample over time, and FIG. 4B representing the ON and OFF switching of the sample radiating light corresponding to the time of FIG. 4A. Comparing this to the embodiment shown in FIGS. 3A and 3B, this example reduces the radiating phase limits of the optical characteristic measuring light. Although there are cases where fluorescent samples receive damage by the light radiation and stop generating fluorescent light, by shortening the radiation time as shown in FIGS. 4A and 4B, damage to fluorescent samples can be further prevented. Also, in the phase where the probe is at maximum proximity to the sample, by reducing the phase limit at which light is radiated, the light radiating area is further reduced, light intensity can be increased, and it is possible to improve resolution.

Figure 5A:
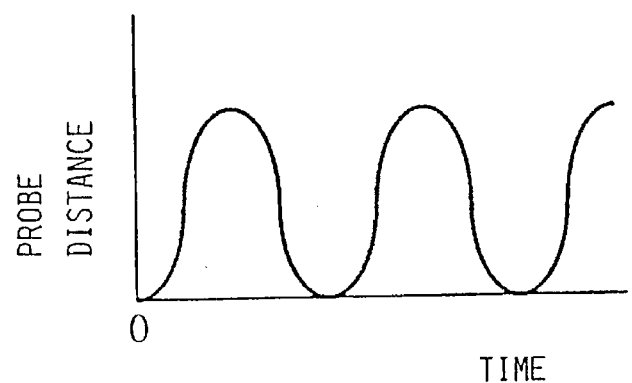
FIGS. 5A and 5B show diagrams of a third example of the phase of sample irradiating light with respect to vibration of the probe.
Figure 5B:
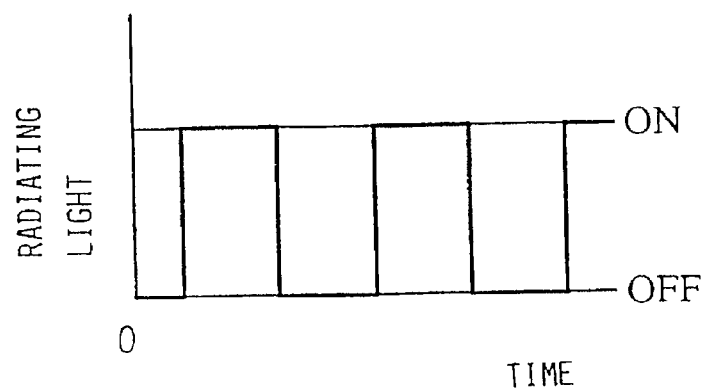

FIGS. 5A and 5B are diagrams showing a third example of the phase of the sample radiating light with respect to the vibration of the probe, FIG. 5A representing the change of the distance between the probe and the sample over time, and FIG. 5B representing the ON and OFF switching of the sample radiating light corresponding to the time of FIG. 5A. Normally the light-propagating probe has a metal covering thereover except for transmittance holes of its distal end, and there are cases where when this metal comes into contact with a fluorescent body the fluorescent energy thereof is absorbed into the metal and fluorescence is not generated. When measuring a fluorescent sample by radiating light at a phase where the distal end of the probe is distanced from the sample surface as shown in FIGS. 5A and 5B, absorption of the fluorescent energy into the metal covering can be prevented and the detected fluorescence intensity increased.

Figure 2:
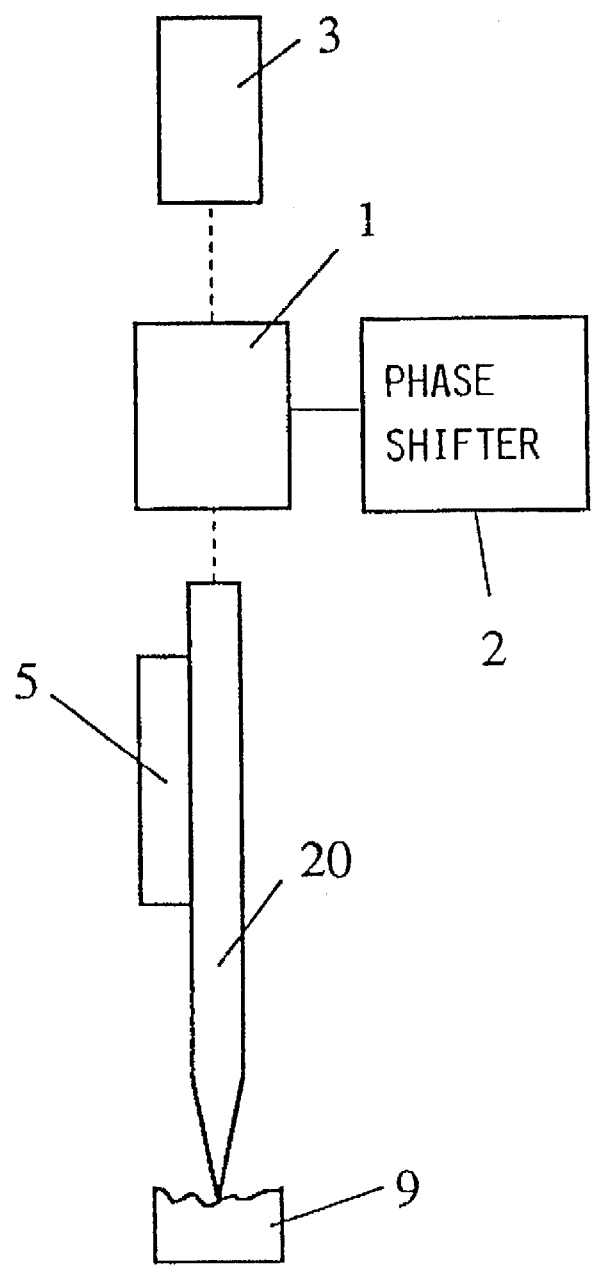
FIG. 2 shows a structure of a shear force type near-field optic/atomic force microscope according to an embodiment of the present invention.

FIG. 2 is a diagram of the structure of a shear force type near-field optic/atomic force microscope according to an embodiment of the present invention, and shows the structure around the probe. A radiated light of an optical characteristic measuring light source 3 is amplitude modulated by an optical modulating means 1 and directed into a light propagating probe 20 disposed in a bimorph 5. The phase and intermittent rate of the optical modulating means 1 are adjusted by a phase shifter 2. This differs from the embodiment shown in FIG. 1 in that the light propagating probe 20 is vibrated horizontally with respect to a sample 9 by the bimorph 5.

According to the structure of a shear force type near-field optic/atomic force microscope as described above, the phase and intermittent rate of the sample radiating light can be arbitrarily changed with respect to the vibration of the probe.

Figure 6A:
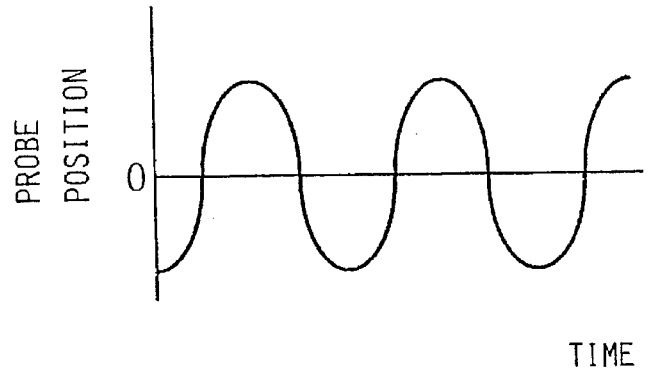
FIGS. 6A and 6B show diagrams of a fourth example of the phase of sample irradiating light with respect to vibration of the probe.
Figure 6B:
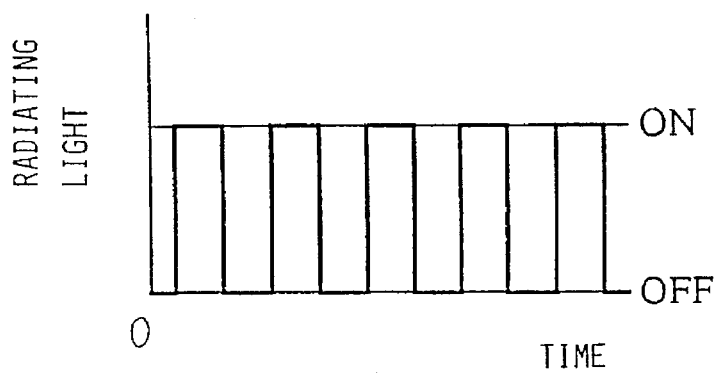

FIGS. 6A and 6B are diagrams showing a fourth example of the phase of the sample radiating light with respect to the vibration of the probe, FIG. 6A representing the change from the vibration center of the distal end position of the probe over time, and FIG. 6B representing the ON and OFF switching of the sample radiating light corresponding to the time of FIG. 6A. As shown in FIGS. 6A and 6B, by doubling the cycle of the sample radiating light and radiating the light around the vibration center, it is possible to align the measurement point and the light radiation point. Consequently, the problem of resolution being reduced due to the radiated light being displaced from the measurement point when the probe is displaced from the vibration center during a vibration cycle phase is solved and it is possible to improve resolution.

Although explanation has been given with regard to measurement of the optical characteristic in the embodiments described above, it is possible to apply the present invention to spectrum measurement of the optical characteristic of a minute region of the sample by directing the optical characteristic light from the sample into an optical spectrometer.

As described above, according to the scanning near-field optic/atomic force microscope of the present invention, it is possible to improve the resolution of a light characteristic image in an apparatus capable of performing measurement of the surface topography and optical characteristic of a sample at high resolution, without relying on the existence of transmissivity and conductivity in the sample.

Further, in measuring a fluorescent sample, the detection light intensity of fluorescent light can be improved without damaging the sample, the damage of the sample can be prevented, and the absorption of fluorescent energy by a metallic layer covering the probe can be prevented.

What is claimed is:

1. A scanning near-field optic/atomic force microscope comprising:

a probe made of a light-propagating body for scanning above a sample to observe a topography and optical characteristics thereof;

vibration means for vibrating a distal end of the probe and the sample relative to one another;

a light source for generating a radiating light onto the sample;

optical modulating means for modulating an amplitude of the radiating light in synchronism with a vibrating position of the distal end of the probe;

a phase shifter for modifying a phase and/or an intermittent rate of the radiating light of the optical modulating means;

displacement detection means for optically detecting displacement of the probe;

a photoelectric converter and optical system for detecting light from the sample; and a rough-motion mechanism and a fine-motion mechanism for moving the sample and the probe relative to each other.

2. A scanning near-field optic/atomic force microscope according to claim 1; wherein the vibration means vibrates the distal end of the probe vertically relative to the surface of the sample; and wherein the optical modulating means modulates the amplitude of the radiating light in synchronism with the vibrating position of the distal end of the probe and the phase shifter modifies the phase and/or the intermittent rate of the radiating light in order to radiate light when the probe is at a maximum proximity to the sample to reduce a light radiation area.

3. A scanning near-field optic/atomic force microscope according to claim 1; wherein the vibration means vibrates the distal end of the probe horizontally relative to the surface of the sample; and wherein the optical modulating means modulates the amplitude of the radiating light in synchronism with the vibrating position of the distal end of the probe and the phase shifter modifies the phase and/or the intermittent rate of the radiating light in order to radiate light in a center of vibration to align a radiation spot to a measuring point on the sample.

* * * * *